(12) United States Patent
Colbert et al.

(10) Patent No.: US 8,363,404 B2
(45) Date of Patent: Jan. 29, 2013

(54) IMPLEMENTING LOADING AND HEAT REMOVAL FOR HUB MODULE ASSEMBLY

(75) Inventors: John L. Colbert, Byron, MN (US); Jason R. Eagle, Kasson, MN (US); Roger D. Hamilton, Rochester, MN (US); Kenneth C. Marston, Poughquag, NY (US); Steven P. Ostrander, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 12/967,854

(22) Filed: Dec. 14, 2010

(65) Prior Publication Data
US 2012/0147563 A1 Jun. 14, 2012

(51) Int. Cl.
*H05K 7/20* (2006.01)
*F28F 7/00* (2006.01)
*H01L 23/34* (2006.01)

(52) U.S. Cl. ...... 361/702; 165/80.2; 165/80.4; 165/185; 257/714; 257/719; 361/699; 361/719

(58) Field of Classification Search .................. None
See application file for complete search history.

(56) References Cited

U.S. PATENT DOCUMENTS

| 6,179,047 | B1 * | 1/2001 | Tustaniwskyj et al. | 165/80.4 |
|---|---|---|---|---|
| 6,930,884 | B2 * | 8/2005 | Cromwell et al. | 361/710 |
| 7,486,516 | B2 * | 2/2009 | Colbert et al. | 361/710 |
| 7,606,033 | B2 * | 10/2009 | Colbert et al. | 361/710 |
| 7,826,229 | B2 * | 11/2010 | Cromwell et al. | 361/719 |
| 7,990,722 | B2 * | 8/2011 | Cao et al. | 361/721 |
| 2004/0252462 | A1 * | 12/2004 | Cromwell et al. | 361/719 |
| 2007/0086168 | A1 * | 4/2007 | Khanna et al. | 361/719 |
| 2012/0098119 | A1 * | 4/2012 | Refai-Ahmed et al. | 257/714 |

* cited by examiner

*Primary Examiner* — Gregory Thompson
(74) *Attorney, Agent, or Firm* — Joan Pennington

(57) ABSTRACT

A method and apparatus are provided for implementing loading and heat removal for a hub module assembly. The hub module assembly includes a hub chip and a plurality of optical modules attached by land grid array (LGA) assembly disposed on a top surface metallurgy (TSM) LGA residing on a hub ceramic substrate. The ceramic substrate is connected to a circuit board through a bottom surface metallurgy (BSM) LGA assembly. A base alignment ring includes a plurality of alignment features for engaging the circuit board and locating an LGA interposer of the BSM LGA assembly. Each of a pair of top alignment rings includes cooperating alignment features for engaging and locating a respective LGA interposer of respective LGA sites of the TSM LGA assembly. The two LGA interposers of the TSM LGA assembly align, retain, and make the electrical connection between the optical modules and the hub chip.

20 Claims, 3 Drawing Sheets

IMPLEMENTING LOADING AND HEAT REMOVAL FOR HUB MODULE ASSEMBLY

STATEMENT REGARDING FEDERALLY SPONSORED RESEARCH OR DEVELOPMENT

This invention was made with Government support under Contract No. HR0011-07-9-0002 awarded by the Department of Defense. The Government has certain rights in this invention.

FIELD OF THE INVENTION

The present invention relates generally to the data processing field, and more particularly, relates to a method and apparatus for implementing loading and heat removal for a hub module assembly including piggybacked land grid array (LGA) attached components on an LGA attached module.

DESCRIPTION OF THE RELATED ART

Some existing supercomputers have compute nodes that route their traffic through racks of switching equipment to other compute nodes. Every switch in this data path adds latency. At a supercomputing scale, there is a point that increasing the number of compute drawers will not increase performance due to the additional switching latency.

In a system using hub modules, networking and compute traffic is routed to idle compute processors with the hub modules to maximize speed and efficiency. In the system, every compute drawer is directly connected to every other compute drawer via the hub modules, which consist of traffic routing hub chips and a network of fiber-optic transmit and receive modules.

In the system with the network of fiber optic transmit and receive modules or fiber optic interconnect, scalability is enabled to a much higher level than previously possible. However, a problem exists to create a reliable arrangement having manufacturability and delivering a required package density.

A need exits for an efficient and effective mechanism for implementing a hub module assembly with fiber optical interconnect providing required positional accuracy and contact force with multiple land grid array (LGA) connections, as well as providing required heat removal, and manufacturability.

SUMMARY OF THE INVENTION

Principal aspects of the present invention are to provide a method and apparatus for implementing loading and heat for a hub module assembly including piggybacked land grid array (LGA) attached components on an LGA attached module. Other important aspects of the present invention are to provide such method and apparatus substantially without negative effects and that overcome many of the disadvantages of prior art arrangements.

In brief, a method and apparatus are provided for implementing loading and heat removal for a hub module assembly. The hub module assembly includes a hub chip and a plurality of optical modules attached by land grid array (LGA) assembly disposed on a top surface metallurgy (TSM) LGA residing on a hub ceramic substrate. The ceramic substrate is connected to a circuit board through a bottom surface metallurgy (BSM) LGA assembly.

In accordance with features of the invention, a base alignment ring includes a plurality of alignment features for engaging the circuit board and locating an LGA interposer of the BSM LGA assembly. Each of a pair of top alignment rings includes cooperating alignment features for engaging and locating a respective LGA interposer of respective LGA sites of the TSM LGA assembly. The LGA interposer of the BSM LGA assembly aligns, retains, and makes the electrical connections between the hub ceramic substrate and the circuit board. Each of the two LGA interposers of the TSM LGA assembly aligns, retains, and makes the electrical connections between the optical modules and the hub chip.

In accordance with features of the invention, a pair of mounting brackets is secured to the ceramic substrate. The base alignment ring and the pair of top alignment rings are attached to the mounting brackets. A heat removal and load assembly including a global heat spreader with each of the plurality of optical modules removes heat and applies module load at the respective LGA sites.

In accordance with features of the invention, the heat removal and load assembly includes the global heat spreader, copper side blocks with each of the plurality of optical modules to facilitate loading of the module to make the LGA interconnect, and also to remove heat created during operation. Each module has a copper saddle that is loaded against the copper side blocks through a first thermal interface material in the heat removal path. Each copper saddle has a small coil spring bearing down on it to provide the controlled load required to make a reliable LGA connection, and to protect from overloading individual optical modules.

In accordance with features of the invention, the coil spring acts as a buffer that prevents the tallest optical module from being crushed and the shortest from getting no load. The optical modules transmit and receive through a flat fiber ribbon that extends horizontally outwardly. A strain relief is provided to isolate the optical modules from the terminal ends of the fiber.

In accordance with features of the invention, the hub module assembly includes a cold plate. The cold plate load is mounted by fastening a plurality of screws on spring end supports, and bottoming a load screw against a laminated spring plate. An indium thin sheet is provided on a top surface of both global heat spreaders and a central copper heat spreader residing on the hub chip, providing a final thermal interface in contact with a base of the cold plate.

In accordance with features of the invention, an associated backside stiffener member is provided with the circuit card.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing loading and heat removal for a hub module assembly including piggybacked land grid array (LGA) attached components on an LGA attached module.

Figure 1:
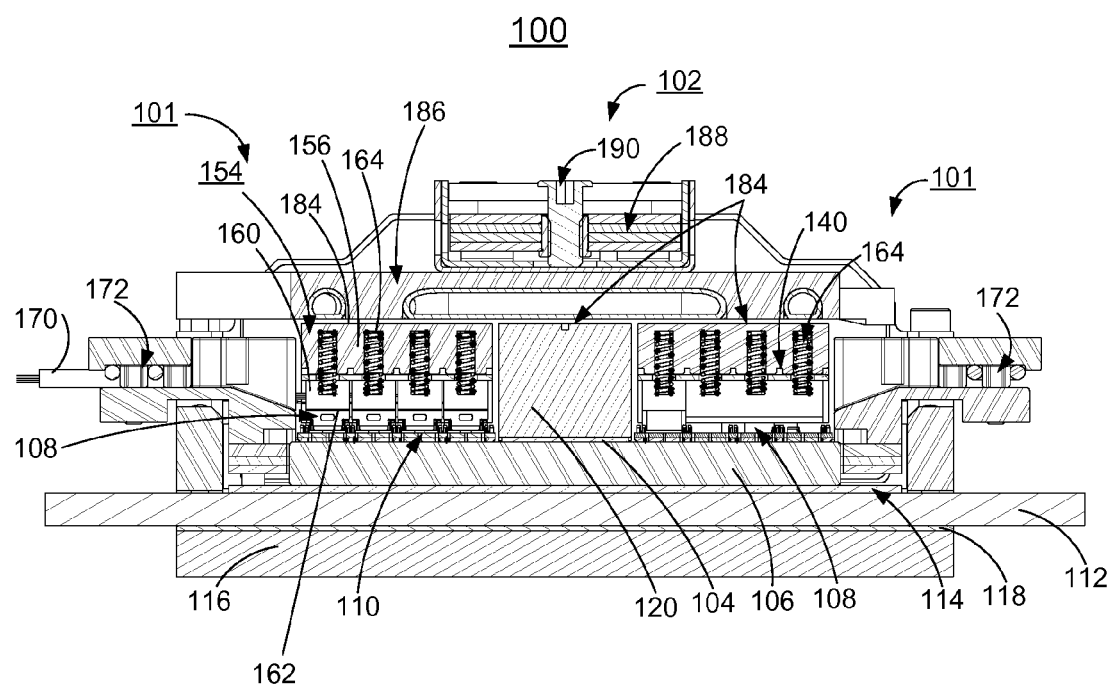
FIG. 1 is a side view not to scale of a hub module assembly in accordance with the preferred embodiment.

Having reference now to the drawings, in FIG. 1, there is shown a hub module assembly generally designated by the reference character 100 in accordance with the preferred embodiment. The hub module assembly 100 includes hub module components assembly generally designated by the reference character 101 and cold plate assembly generally designated by the reference character 102 in accordance with the preferred embodiment. The hub module assembly 100 includes apparatus for implementing enhanced loading and heat removal for the self-contained unitary hub module assembly.

The hub module assembly 100 includes a hub chip 104 carried by a hub ceramic substrate 106, and a plurality of optical modules 108 attached by a top surface metallurgy (TSM) land grid array (LGA) assembly 110 residing on the hub ceramic substrate 106. The ceramic substrate 106 is connected to a circuit board 112 through a bottom surface metallurgy (BSM) LGA interposer 114. The circuit card 112 is mounted on an associated backside stiffener member 116 separated by an insulator 118.

Figure 2:
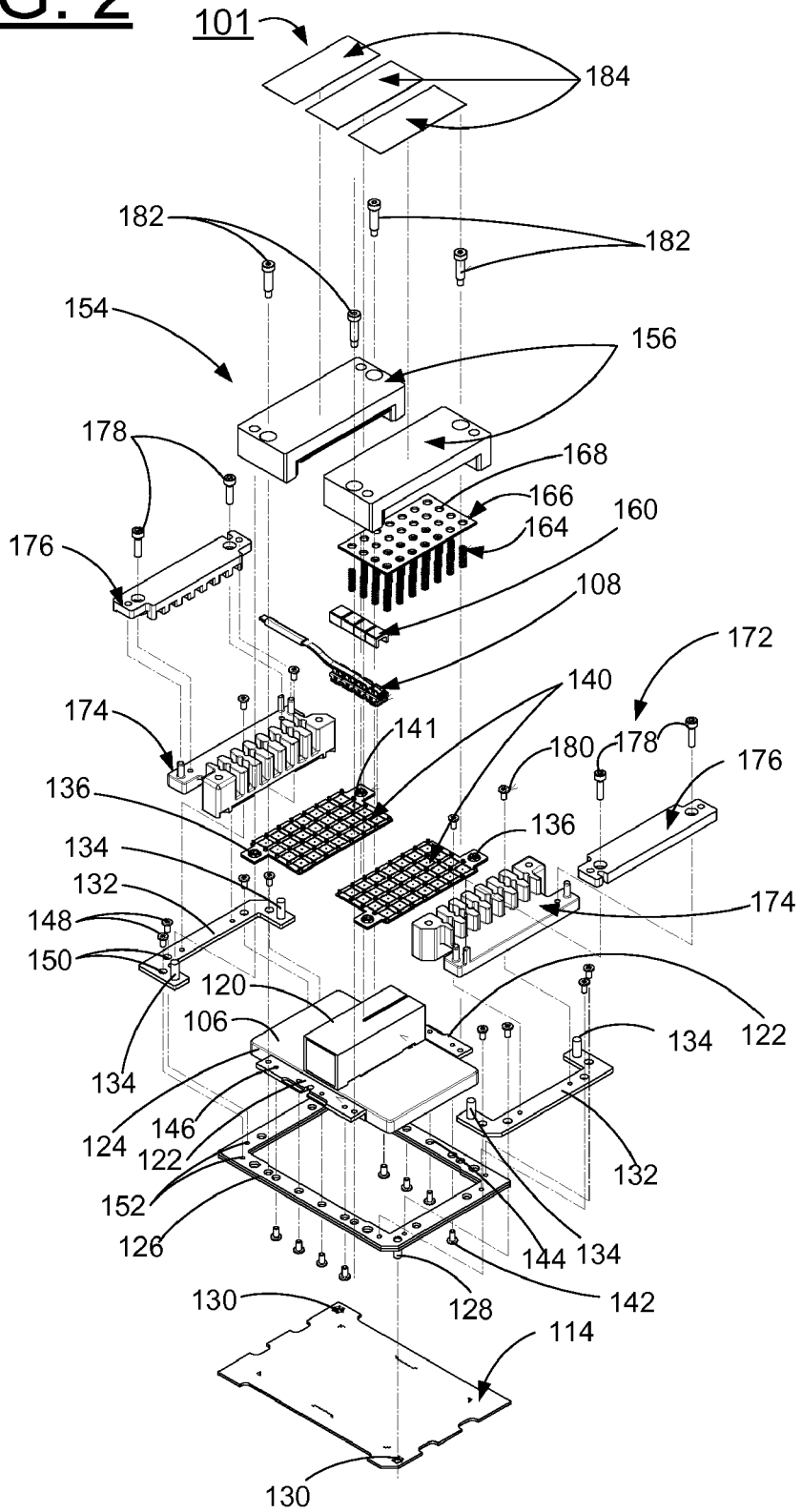
FIG. 2 is an exploded perspective view not to scale illustrating hub module components in accordance with the preferred embodiment.

Referring also to FIG. 2, hub module components 101 are shown in accordance with the preferred embodiment. A central hub chip copper heat spreader 120 resides on the hub chip 104 shown in FIG. 1. A pair of bonded mounting angle brackets 122 is secured to opposed long sides 124 of the ceramic substrate 106. A unitary base alignment ring 126 includes a plurality of alignment features including an alignment dowel pins 128 received through LGA interposer alignment aperture 130 with retention features or nubs for engaging the circuit board 112 shown in FIG. 1 and locating the BSM LGA interposer 114 with the circuit board. The unitary base alignment ring 126 is optically aligned with the BSM LGA pad array on the ceramic substrate 106. Each of a pair of top alignment rings 132 includes cooperating alignment features 134, such as dowel pins 134 received within a respective LGA interposer alignment aperture 136 with retention features or nubs for engaging and locating respective LGA sites of a respective LGA interposer 140 of the TSM LGA assembly 110. The pair of top alignment rings 132 are optically aligned with the respective TSM LGA pad array on the ceramic substrate 106. The two LGA interposers 140 of the TSM LGA assembly 110 align, retain, and make the electrical connection between the optical modules 108 and the hub chip 104.

Each of the two LGA interposers 140 include molded features 141 in the interposer act as springs to center the optical modules 108. Also features in the alignment apertures 136 center the holes on the pins as well as aid retention of a loose interposer onto the dowel pins. The molded features 141 include also small hook features which retain individual modules 108 once they are set on the LGA interposer 140.

A plurality of lower alignment ring mounting screws 142 are received through corresponding respective apertures 144 having required positioning clearance for the optical alignment process and threaded apertures 146 in the unitary base alignment ring 126 and the edge bonded mounting angle brackets 124. A plurality of upper alignment ring mounting screws 148 are received through corresponding respective apertures 150 having required positioning clearance for the optical alignment process and threaded apertures 152 in the pair of top alignment rings 132 and the unitary base alignment ring 126.

The base alignment ring 126 and the pair of top alignment rings 132 are attached to the mounting brackets 122. A heat removal and load assembly 154 including a respective global heat spreader member 156 provided with a respective group of the plurality of optical modules 108 that removes heat and applies module load at the respective LGA sites on the top surface metallurgy (TSM) LGA assembly 110.

For example, the hub module assembly 100 includes fifty-six (56) optical modules 108 arranged in two groups of 28 optical modules 108 mirrored about the center hub chip 104. The optical modules 108 are optical laser transmitter and receiver modules having via land grid array (LGA) connections on the top surface metallurgy (TSM) LGA assembly 110 residing on the ceramic substrate 106.

The heat removal and load assembly 154 includes the global heat spreader 156 shown in FIG. 2 with each of the plurality of optical modules 108 to facilitate loading of the module to make the LGA interconnect, and also to remove heat created during operation. Each module 108 has a copper saddle 160 best shown in FIG. 2 that is loaded against the global heat spreader 156 through the first thermal interface material 162 in the heat removal path. Each copper saddle 160 has a small coil spring 164 bearing down on it to provide the controlled load required to make a reliable LGA connection, and to protect from overloading individual optical modules 108.

In accordance with features of the invention, due to the high load required on the overall assembly, for example, approximately 680 lbs and the small load required on each optical module, such as less than 10 lbs, the coil spring 164 functions as a buffer, preventing the tallest optical module 108 from being crushed and the shortest from getting no load. The coil springs 164 are bonded into cavities in the global heat spreader 156. The global heat spreader 156 has a perforated sheet 166 of thermal interface material (TIM) with respective openings 168 on the base that allows each coil spring 164 to pass through, but touches the remaining area of the top of each saddle 156. The optical modules 108 transmit and receive through a flat fiber ribbon 170 that escapes horizontally.

Due to the hand-plug nature of the hub modules 108 and the potential of accidentally influencing the positions of modules 108 while handling and manipulating fiber 170, for example, due to the light preload, a strain relief assembly 172 is provided to isolate the optical modules from the terminal ends of the fiber 170.

As shown in FIGS. 1 and 2, the strain relief assembly 172 includes a flat ribbon strain relief member 174, a strain relief cover member 176, a plurality of strain relief cover mounting screws 178, and a plurality of fiber ribbon strain relief mounting screws 180. A plurality of global heat spreader mounting screws 182 are received through each of the global heat spreader members 156 fastening to the mounting brackets 122. An upper, final thermal interface 184 is provided by a respective thin sheet of indium resting on the top surface of the global heat spreader members 156 and the central copper heat spreader 120 residing on the hub chip 104.

Figure 3:
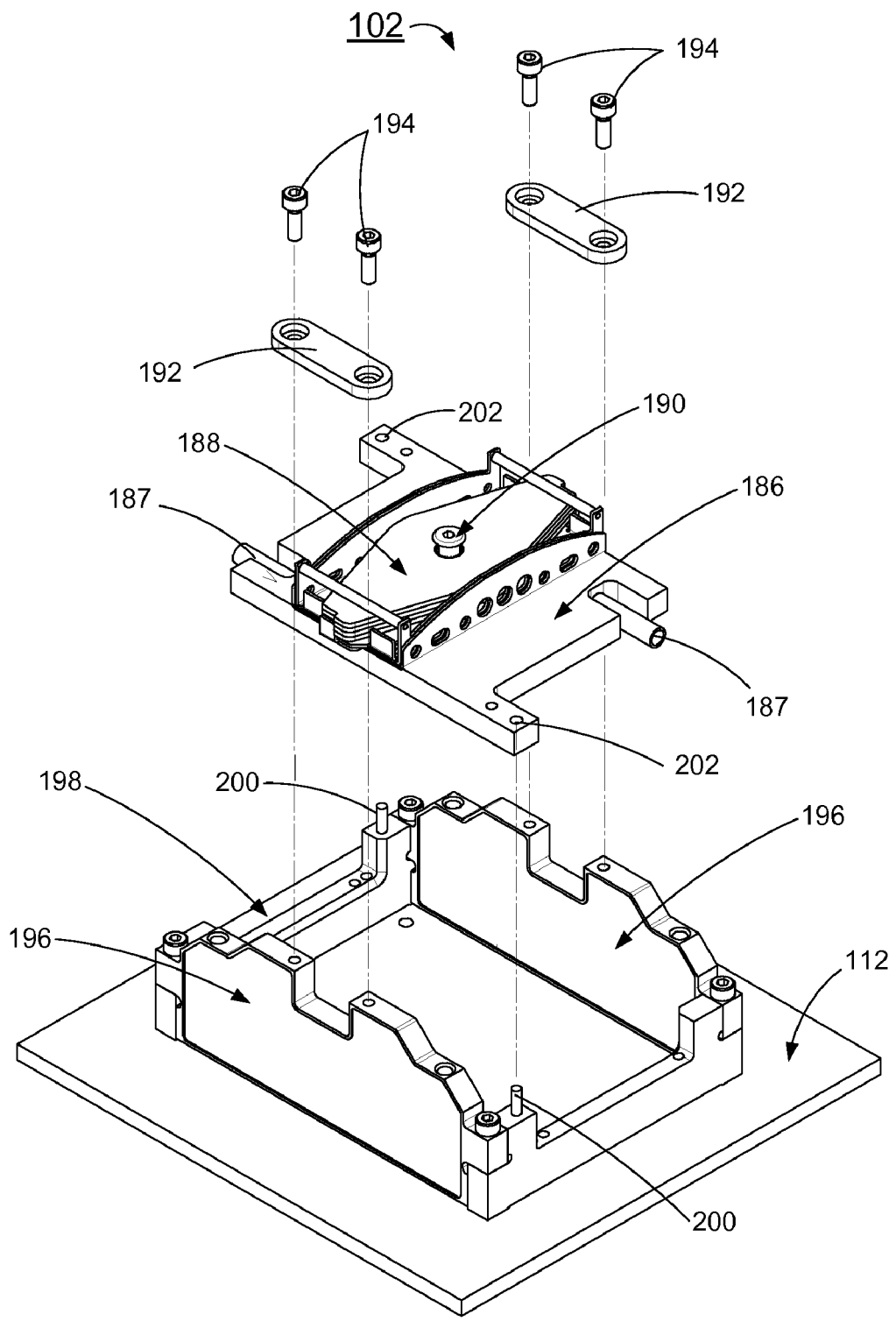
FIG. 3 is an exploded perspective view not to scale illustrating cold plate assembly in accordance with the preferred embodiment.

Referring also to FIG. 3, there is shown a cold plate assembly generally designated 102 of the hub module assembly 100 in accordance with the preferred embodiment. The cold plate assembly 102 includes a water cooled cold plate 186. Cooling water is circulated through conduits 187. The indium thin sheet final thermal interface 184 provided on the top surface of both global heat spreaders 156 and the central copper heat spreader 120 is located in contact engagement with the base of the cold plate 186. The indium pads 184 can be reused if a system is reworked within manufacturing, which reduces cost and decreases system rework cycle time.

The cold plate assembly 102 includes a laminated spring plate 188, a centrally located screw 190, and a pair of spring end support brackets 192 receiving spring end support bracket screws 194 and mounted to a respective card mounted cross brace 196. A pair of long stiffening rails 198 provided between the card mounted cross brace 196 and mounted to the circuit board 112. The long stiffening rails 198 and the cold plate 186 includes respective cooperating alignment features 200 and 202 positioning and retaining the cold plate 186.

The cold plate load is provided by fastening the plurality of screws 194 on the spring end support brackets 192 and the card mounted cross braces 196, and bottoming the head of the load screw 190 against the laminated spring plate 188. A total system load of 680 lbs is generated by deflecting the laminated spring plate 188 retained at both ends via the centrally located screw 190. The screw tip acts directly on the cold plate assembly 102, driving the reaction load vertically through the hardware stack.

When the hub module 101 is not loaded by a cold plate 186, the global heat spreader top surfaces are higher than the top of the central copper heat spreader 120 residing on the hub chip. Each global heat spreader 156 is captivated by the global heat spreader mounting shoulder screws 182, and in this condition there is some small coil spring compression that maintains a preload on the optical modules 108. This maintains optical module position, as well as reducing wear on the gold LGA pads due to vibration induced surface scrubbing. When the cold plate load is applied, both global heat spreaders 156 move down, compressing the array of coil springs 164, increasing the module load at the respective TSM LGA sites. When the top surfaces of the global heat spreaders 156 and the central copper heat spreader 120 are coplanar, the full design load has been applied to the optical module TSM LGA sites. The physical down stop of the central copper heat spreader 120 prevents overloading these components, because the coil springs 164 can no longer be compressed. Additional loading after the surfaces are coplanar passes through the central copper heat spreader 120 and hub chip 104 to the BSM LGA connection onto the circuit board 112, but does not increase the load on the optical modules 108 or TSM 110. By design, for example, 200 lbs load passes through each global heat spreader 156 to each bank of 28 optics modules 108 and 280 lbs passing through the center spreader 120, resulting in a total of 680 lbs nominal on the BSM LGA 114. These loads are defined by how many LGA contacts are present, and the contact force requirement per contact.

In brief, the hub module assembly 100 is a reliable arrangement with effective manufacturability that delivers required package density. One of the main principles of the hub module assembly 100 is to push complexity of system assembly into the hub module components assembly 101 by making the module self contained, test-able and shippable at the unit level, as well as hand place-able. The hub module components assembly 101 includes a large number of components, thermal interfaces, and springs while on the system manufacturing floor, the hub module is installed by hand, and the cold plate assembly 102 applies the cold plate load provided by fastening the 4 screws 194 on the spring end supports 192, 196, and bottoming the load screw 190 against the laminated spring plate 188. Also, due to the water cooled nature of the hub module assembly 100, heat is effectively moved to the top thermal interface 184 of the hub module components assembly 101 contacting the single cold plate 186.

While the present invention has been described with reference to the details of the embodiments of the invention shown in the drawing, these details are not intended to limit the scope of the invention as claimed in the appended claims.

What is claimed is:

1. An apparatus for implementing loading and heat removal for a hub module assembly comprising:
   a circuit board;
   a hub ceramic substrate disposed above said circuit board;
   a hub chip residing on said hub ceramic substrate;
   a plurality of optical modules residing on said hub ceramic substrate;
   a top surface metallurgy (TSM) land grid array (LGA) assembly disposed on said hub ceramic substrate, said TSM LGA assembly including a plurality of LGA sites connecting said hub chip and said plurality of optical modules;
   a bottom surface metallurgy (BSM) LGA assembly, said TSM LGA assembly including at least one LGA site connecting said hub ceramic substrate to said circuit board; and
   a heat removal and load assembly including a global heat spreader engaged with said plurality of optical modules removing heat and applying module load at respective ones of said plurality of LGA sites.

2. The apparatus as recited in claim 1 wherein each of said TSM LGA assembly and said BSM LGA assembly includes at least one LGA interposer, each said at least one LGA interposer aligning, retaining, and making respective electrical connections.

3. The apparatus as recited in claim 2 includes at least one strain relief assembly provided with said plurality of optical modules.

4. The apparatus as recited in claim 2 includes a base alignment ring including a plurality of alignment features for engaging said circuit board and locating each said at least one LGA interposer of the BSM LGA assembly.

5. The apparatus as recited in claim 2 includes a pair of top alignment rings, each includes cooperating alignment features for engaging and locating a respective one of a pair of said at least one LGA interposer of respective LGA sites of the TSM LGA assembly.

6. The apparatus as recited in claim 1 includes a pair of brackets mounted to said hub ceramic substrate; each of said pair of brackets mounted to a base alignment ring and mounted to a pair of top alignment rings.

7. The apparatus as recited in claim 6 wherein said base alignment ring includes a plurality of alignment features cooperative engaging said circuit board.

8. The apparatus as recited in claim 5 wherein said TSM LGA assembly includes a pair of LGA interposers, and wherein said pair of top alignment rings includes a plurality of alignment features cooperative engaging said pair of LGA interposers.

9. The apparatus as recited in claim 1 includes a heat spreader engaging said hub chip.

10. The apparatus as recited in claim 9 includes a pair of said global heat spreaders engaging said plurality of optical modules, and said heat spreader engaging said hub chip is located between said pair of said global heat spreaders.

11. The apparatus as recited in claim 1 wherein said heat removal and load assembly includes a respective coil spring engaging each of said plurality of optical modules.

12. The apparatus as recited in claim 11 wherein each said respective coil spring is secured to said global heat spreader.

13. The apparatus as recited in claim 11 wherein said heat removal and load assembly includes a thermal interface material (TIM) engaging said global heat spreader with respective openings receiving each said coil spring.

14. The apparatus as recited in claim 1 wherein said heat removal and load assembly includes a respective upper thermal interface material (TIM) disposed on a top surface of each of a pair of said global heat spreaders engaging said plurality of optical modules, and disposed on a top surface of said heat spreader engaging said hub chip.

15. The apparatus as recited in claim 14 wherein said respective upper thermal interface material (TIM) includes a respective indium sheet.

16. The apparatus as recited in claim 1 includes a cold plate assembly including a water cooled cold plate.

17. The apparatus as recited in claim 16 wherein said cold plate assembly includes a laminated spring plate and a centrally located load screw.

18. The apparatus as recited in claim 16 wherein said cold plate assembly includes a respective card mounted cross brace mounted to said circuit board and a pair of spring end support brackets mounted to respective card mounted cross brace.

19. A method for implementing loading and heat removal for a hub module assembly comprising:
   providing a circuit board;
   providing a hub ceramic substrate disposed above said circuit board;
   providing a hub chip residing on said hub ceramic substrate;
   providing a plurality of optical modules residing on said hub ceramic substrate;
   providing a top surface metallurgy (TSM) land grid array (LGA) assembly disposed on said hub ceramic substrate, said TSM LGA assembly including a plurality of LGA sites connecting said hub chip and said plurality of optical modules;
   providing a bottom surface metallurgy (BSM) LGA assembly, said TSM LGA assembly including at least one LGA site connecting said hub ceramic substrate to said circuit board; and
   providing a heat removal and load assembly including a global heat spreader engaged with said plurality of optical modules removing heat and applying module load at respective ones of said plurality of LGA sites.

20. The method as recited in claim 19 wherein providing a heat removal and load assembly includes providing a heat spreader engaging said hub chip and includes providing a cold plate assembly engaging said global heat spreader and engaging said heat spreader.

* * * * *